(12) United States Patent
Ong

(10) Patent No.: US 6,835,657 B2
(45) Date of Patent: Dec. 28, 2004

(54) METHOD FOR RECRYSTALLIZING METAL IN FEATURES OF A SEMICONDUCTOR CHIP

(75) Inventor: Edith Ong, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/308,361

(22) Filed: Dec. 2, 2002

(65) Prior Publication Data

US 2004/0104481 A1 Jun. 3, 2004

(51) Int. Cl.$^7$ .............................................. H01L 21/44
(52) U.S. Cl. ..................... 438/662; 438/626; 257/751
(58) Field of Search ................... 257/750, 751, 257/762, 767, 752; 438/662, 940, 626, 627

(56) References Cited

U.S. PATENT DOCUMENTS

| | | | |
|---|---|---|---|
| 5,405,804 A | * 4/1995 | Yabe | 438/662 |
| 6,004,880 A | 12/1999 | Liu et al. | |
| 6,103,624 A | * 8/2000 | Nogami et al. | 438/687 |
| 6,143,650 A | * 11/2000 | Pramanick et al. | 438/643 |
| 6,328,872 B1 | 12/2001 | Talieh et al. | |
| 6,392,299 B1 | 5/2002 | Gayet | |
| 6,402,925 B2 | 6/2002 | Talieh | |
| 6,429,523 B1 | 8/2002 | Andricacos et al. | |
| 6,468,871 B1 | * 10/2002 | Naem | 438/378 |

OTHER PUBLICATIONS

Kawamoto et al., 1999, "The outlook for semiconductor processes and manufacturing technologies in the 0.1–μm age," *Hitachi Review*, 48:334–339.
Wang et al., 1992, "Properties of Cu film under XeCl excimer laser irradiation," *J. Vac. Sci. Technol.*, 10:149–159.
Wang et al., 1992, "Filling of contacts and interconnects with Cu under XeCl excimer laser irradiation," *J. Vac. Sci. Technol.*, 10:160–165.
Graham et al., "Thermally driven recrystallisation of electroplated copper," *Semiconductor Fabtech*, 11$^{th}$ Ed., 279–282.
Ryu, Changsup, 1998, "Microstructure and reliability of copper interconnects: a dissertation submitted to the department of materials science and engineering and the committee on graduate studies of Stanford University in partial fulfillment of the requirement for the degree of doctor of philosophy in materials science and engineering," *Integrated Circuits Laboratory Center for Integrated Systems—Stanford University, Stanford, California 94305*.

* cited by examiner

Primary Examiner—S. V. Clark
(74) Attorney, Agent, or Firm—Moser, Patterson & Sheridan

(57) ABSTRACT

A method for manufacturing a semiconductor structure having an interlevel dielectric comprising (i) patterning features in the interlevel dielectric, (ii) depositing a metal into the features, and (iii) melting and recrystallizing metal in the features using a laser. Semiconductor structures having an interlevel dielectric that are made by the method. The recrystallizing step comprises exposing the metal in the features to a laser annealing protocol. The protocol includes exposing the metal to a laser having a predetermined wavelength selected from the range of 150 nm to 900 nm. In some instances, the laser used in the laser annealing protocol has an output pulse energy of about 1.0 joules/cm2 to about 4.0 joules/cm$^2$. In some instances, the semiconductor structure is on a substrate and the recrystallizing step comprises simultaneously exposing the entire semiconductor structure to the laser. In other instances, the semiconductor structure is on a substrate and the recrystallizing step comprises exposing a first portion of the substrate at a first time $t_1$ and a second portion of the substrate at a second, subsequent, time $t_2$.

43 Claims, 7 Drawing Sheets

METHOD FOR RECRYSTALLIZING METAL IN FEATURES OF A SEMICONDUCTOR CHIP

FIELD OF THE INVENTION

This invention relates to methods for recrystallizing metal in features of a semiconductor chip as part of a global planarization stepduring the manufacture of the chip, which by the method of recrystallization, also enhances the electromigration resistance of the film as well as alleviates the resistivity increase of metal lines in the regime below 200 nm due to grain boundary scattering and other interfacial effects.

BACKGROUND OF THE INVENTION

The development of ultra-large-scale integration (ULSI) requires higher integration density with smaller design rules. Aluminum alloys have been widely used as metallization materials, but for ultra-large scale integration (ULSI) (e.g., the use of integrated circuits with more than a million logic gates), they are susceptible to electromigration and stress migration. The device performance has also become limited by the RC delay associated with aluminum alloy interconnects. An example of a multilayer ULSI application is illustrated in FIG. 7. In FIG. 7, features such as vias 710 and 712 connect one or more interconnect layers 702.

As ULSI technology progresses, the feature size (e.g. size of interconnects, vias, contacts) decreases while chip size increases. The lengths of features also increase, leading to higher resistances. The distance between adjacent features lessens. The capacitance between the adjacent features, therefore, increases although the capacitance between the feature and the ground substrate decreases, resulting in an increase in the total feature capacitance in the submicron range. Since both line resistance, R, and the capacitance associated with the dielectric, C, contribute to the interconnect delay, the total interconnect delay increases rapidly as the feature size decreases in the submicron range. The RC delay is given by:

$$RC \approx \frac{\rho}{t_M} \frac{L^2 \varepsilon_{ILD}}{t_{ILD}}$$

where $\rho$, $L$, and $t_M$, are the resistivity, length and thickness of the interconnect, and $\varepsilon_{ILD}$ and $t_{ILD}$ are the permittivity and thickness of the interlevel dielectric (ILD).

To reduce the RC delay, two approaches are used. One lowers C by adapting low permittivity (low-K) materials as interlevel dielectrics (ILD). Such materials include SiOF, SiOC, polymers, etc. The other lowers R by using interconnect materials with lower resistivity. Al and Al alloys have been used as interconnect materials for more than 30 years. Only three elements exhibit lower resistivity than aluminum: gold, silver, and copper. Among them, gold has the highest resistivity. Although silver has the lowest resistivity, it has poor electromigration reliability. Copper offers good mechanical and electrical properties. The resistivity of copper is about 40% better than that of aluminum. The self-diffusivity of copper is also the smallest among the four elements, resulting in improved reliability. Therefore, copper or copper alloys are promising materials for ULSI applications, such as the application illustrated in FIG. 7. One advantage of using copper and/or low-K dielectric is that the required number of layers 702 (FIG. 7) in a ULSI application can be reduced.

There are a number of ways in which semiconductors are manufactured. Referring to FIG. 1a, in a typical approach, known as the Damascene process, interlevel dielectric 102 is deposited. Next, trenches 104 are patterned by a method such as reactive ion etching (RIE). Then, optionally, a diffusion barrier 106 (FIG. 1b) is deposited. Optional diffusion barrier 106 is usually needed for copper and copper alloy applications because copper and copper alloys typically have poor adhesion to typical dielectric materials. Further, typical dielectric materials are not effective barriers for copper. Thus, copper can diffuse into the dielectric materials causing a degradation in the device performance.

After the diffusion barrier 106 has been deposited, metal (e.g., copper or a copper alloy) is deposited using a metal deposition technique, such as electrochemical deposition, to form interconnects 108 (FIG. 1c), vias, contacts or other features (not shown). Finally, excess copper or copper alloy (overburden 110; FIG. 1c) and barrier layers in the filled region are planarized. When overburden 110 is planarized, it becomes more even, and is no longer referred to as an overburden. Rather, it is referred to as a planarized metal surface over dielectric layer 102. Global planarization of overburden 110 is achieved by methods such as chemical mechanical polishing (CMP). Thus, after CMP, the metal above dielectric layer 102 is removed, leaving only metal inside trenches and vias (e.g., interconnect 108) (FIG. 1d). See, for example, Murarka et al., 1993, *MRS Bulletin* 18, 46–51; and Contolini et al., 1997, *Solid State Technology* 40, 155–162.

Referring to FIG. 2, a typical ULSI application has multiple layers of interconnects 108. Successive layers of interconnects 108 are connected by vias 202 (FIG. 2i). When metal such as copper or copper alloy is used for both interconnects 108 and vias 202, the dual Damascene process is often used to form the ULSI application. See, for example, Kaanta et al., 1991, IEEE VMIC Conf., pp. 144–52. The self-aligned dual Damascene process is illustrated in FIG. 2. In the process, via 202 and interconnect 108 shapes are reactive ion etch patterned on interlayer dielectrics by two etching steps. Then, copper or copper alloy deposition and chemical mechanical polishing is performed only once.

Regardless of whether the single or dual Damascene process is used, the final CMP step is made more difficult because of the uneven nature of overburden 110. In typical ULSI applications, the density of features, such as interconnects 108 and vias 202, is not uniform. In areas of high feature density, overburden 110 is thinner than in areas where feature density is relatively sparse. As feature size is reduced, overburden 110 unevenness becomes an even larger obstacle to achieving global planarization and leads to the undesired properties of non-uniform and inconsistent metal lines resistivities during manufacturing.

Another obstacle in the use of copper or copper alloy in ULSI applications is their electromigration properties. The electromigration phenomenon occurs when the superposition of an electric field onto random thermal diffusion in a metallic solid causes a net drift of atoms in the direction of electron flow. Electromigration leads to degradation in interconnect reliability.

Still another obstacle in the use of copper and copper alloys in ULSI applications is stress migration resistance. Stress migration resistance arises due to a high degree of intrinsic stress in copper or copper alloy interconnects, vias, contacts, as well as other features created using electrochemical deposition (ECD). ECD copper grains are very small. For deposition purposes, this grain size is advantageous because it facilitates deposition into deep features in the ULSI application that have very high aspect ratios without the formation of gaps or other voids. However, the resulting fine-grained film deposition is under a high degree of intrinsic stress due to an excess of vacancies, dislocations, and other crystalline imperfections. See, for example, Ritzdorf et al, 1998, IEEE Proc. Int'l Interconnect Tech. Conf., pp. 106–108.

In some ULSI applications, there are more than 100 line segments connecting devices, each line carrying current densities as high as 0.4 mA/cm$^2$. See Thompson & Lloyd, (June 1993), MRS Bulletin pp. 19–24. Compared to the maximum current density for household wiring of about $10^2$ A/cm$^2$, theses are significantly higher current densities. At such large current densities, electrons scatter with metal atoms, and the transferred momentum results in atomic migration. As atoms electromigrate, voids are formed at upstream and hillocks are formed at downstream of electron flow (FIG. 3). Voids and hillocks will grow and eventually cause open circuit or short circuit failure. It is known that larger grain size reduces problems with electromigration. However, techniques such as electroplating produce very small grain size.

In summary, the condition of copper and/or copper alloy (e.g., a copper aluminum alloy) that has been electrochemically deposited in ULSI applications is undesirable because of difficulties with subsequent CMP polishing of uneven overburden layers as well as the electromigration and stress migration resistance properties of copper and/or copper alloy. To remedy these deficiencies, Graham et al., 2000, Semiconductor Fabtech 11$^{th}$ Edition, pp. 279–282, http://www.fabtech.org, proposed a rapid thermal anneal driven recrystallization scheme in which electroplated copper is recrystallized. Graham et al. report that rapid thermal annealing of electroplated copper results in recrystallization of the copper. Furthermore, the recrystallized copper has larger grain sizes.

Although the Graham et al. approach appears promising, there are drawbacks. First, the approach requires exposing the entire structure to elevated temperatures, which could damage the structure. Second, the Graham et al. data indicates that higher temperatures are required to recrystallize copper in 0.25 micron features as opposed to 0.75 micron features. Thus, the Graham et al. approach requires increasing temperatures as feature sizes are made smaller. Thus, the Graham et al. approach may not work for feature sizes that are used in current and planned ULSI applications.

According to the above background, what is needed in the art are improved methods for recrystallizing metals used in interconnects, vias, contacts, as well as other features of ULSI applications in order to facilitate planarization of interconnect layers and improve the electromigration, stress migration resistance, and resistivity increase of these metals. Such techniques are particularly needed in applications in which metals are embedded in subhundred nanometer trenches which incur substantial resistivity increases due to grain boundary scattering effects.

SUMMARY OF THE INVENTION

The present invention provides an improved method for recrystallizing metals used in interconnects, vias, contacts, as well as other features of ULSI applications. In the present invention, a laser is used to recrystallize metal in order to facilitate planarization of interconnect layers, to improve the electromigration and stress migration resistance properties of these metals, and to alleviate the resistivity increase in metals embedded in small trenches (e.g., 200 nm or less, 100 nm or less) due to grain boundary scattering effects.

One aspect of the present invention provides a method for manufacturing a semiconductor structure having an interlevel dielectric. The method comprises (i) patterning features in the interlevel dielectric, (ii) depositing a metal into the features, and (iii) recrystallizing metal in the features using a laser. In some embodiments, the features are patterned by reactive ion etching (RIE). In some embodiments, the features comprise any combination of interconnects, vias, and contacts. In some embodiments, the deposition is performed by physical vapor deposition (e.g, RF sputtering, bias sputtering, thermal assisted bias sputtering), evaporation, ion beam deposition, thermally assisted ion cluster deposition, chemical vapor deposition, electroless plating, electroplating, electrochemical deposition, etc).

In some embodiments, the method further comprises coating the features with a diffusion barrier prior to the depositing step. In some embodiments, the method further comprises removing an overburden of the metal by chemical mechanical polishing (CMP).

In some embodiments, the recrystallizing step comprises exposing the metal in the features to a laser annealing protocol that includes exposing the metal to a laser having a predetermined wavelength. In some embodiments, the wavelength is selected from the range of 150 nm to 900 nm. In some embodiments, the wavelength is selected from the range of 150 nm to 450 nm. In some embodiments, the laser annealing protocol comprises a single laser pulse that is selected from a pulse length range, wherein a lower boundary of the pulse length range is determined by a requirement that the metal in the feature melt for a period of time. In some embodiments, the laser used in the laser annealing protocol has an output pulse energy of about 1.0 joules/cm$^2$ to about 4.0 joules/cm$^2$.

Another aspect of the present invention provides a semiconductor structure having an interlevel dielectric. The semiconductor structure is made by a process comprising (i) patterning features in the interlevel dielectric, (ii) depositing a metal into the features, (iii) melting and recrystallizing metal in the features using a laser. In some embodiments, the process further comprises coating the features with a diffusion barrier prior to the depositing step.

In still other embodiments, the process further comprises removing an overburden of the metal by chemical mechanical polishing (CMP).

BRIEF DESCRIPTION OF THE DRAWINGS

Like reference numerals refer to the corresponding parts throughout the several views of the drawings.

DETAILED DESCRIPTION OF THE INVENTION

The present invention provides methods for manufacturing semiconductor structures as well as the semiconductor structures manufactured by the inventive methods. In typical embodiments, the semiconductor structure comprises several interconnect layers. Each interconnect layer includes an interlevel dielectric in which features, such as interconnects, vias, contacts and other features are found. The invention addresses an important need in the art to effect complete metal fill and global planarization of each interconnect layer of the semiconductor structure. In addition, it also addresses the need for enhancing the electromigration resistance of the metal lines as well as maintaining the low resistivity of metal lines. Typically, this is accomplished in the art using chemical mechanical polishing methods after each interconnect layer has been patterned and filled. However, as feature size is reduced (e.g., below 200 nm, below 100 nm, etc.), and a switch from aluminum to copper and copper based alloy is made, the process window for successful global planarization using chemical mechanical polishing methods becomes smaller with the introduction of low k dielectric. The present invention addresses this problem.

In the present invention, the metal used to fill features in each interconnect layer is melted and recrystallized using a very short laser pulse. The reflow process resulting from melting flattens the overburden (e.g., overburden 110, FIG. 1c) that forms after metal deposition into the features in the interconnect layer. This serves to increase the process window for chemical mechanical polishing. An additional benefit that is realized upon recrystallization of the metal in the features in the interconnect layer is that the grain size of the metal increases. In some instances the metal forms a bamboo like single crystal structure inside a narrow via or trench, thereby improving the electromigration and stress migration properties of the metal. Another benefit that is realized by the melting and recrystallization of the metal is that, in the case where feature size is 200 nm or less, the resisitivity of the metal in the feature is lowered. In some instances, the resisitivity of the metal in the features approaches the resisitivity that the metal used to fill the features has when it is in bulk form.

Figure 1:
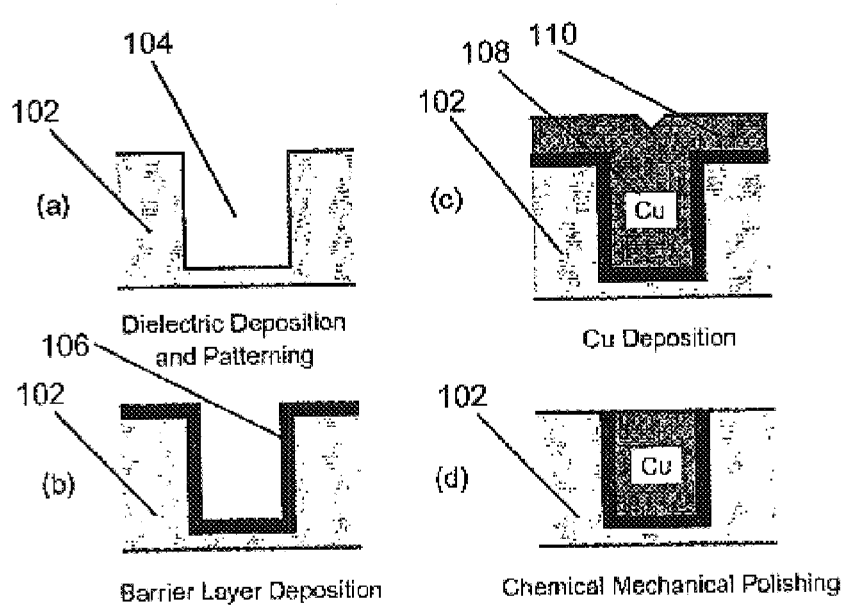
FIG. 1 illustrates a Damascene process for copper interconnects in accordance with the prior art.
Figure 2:
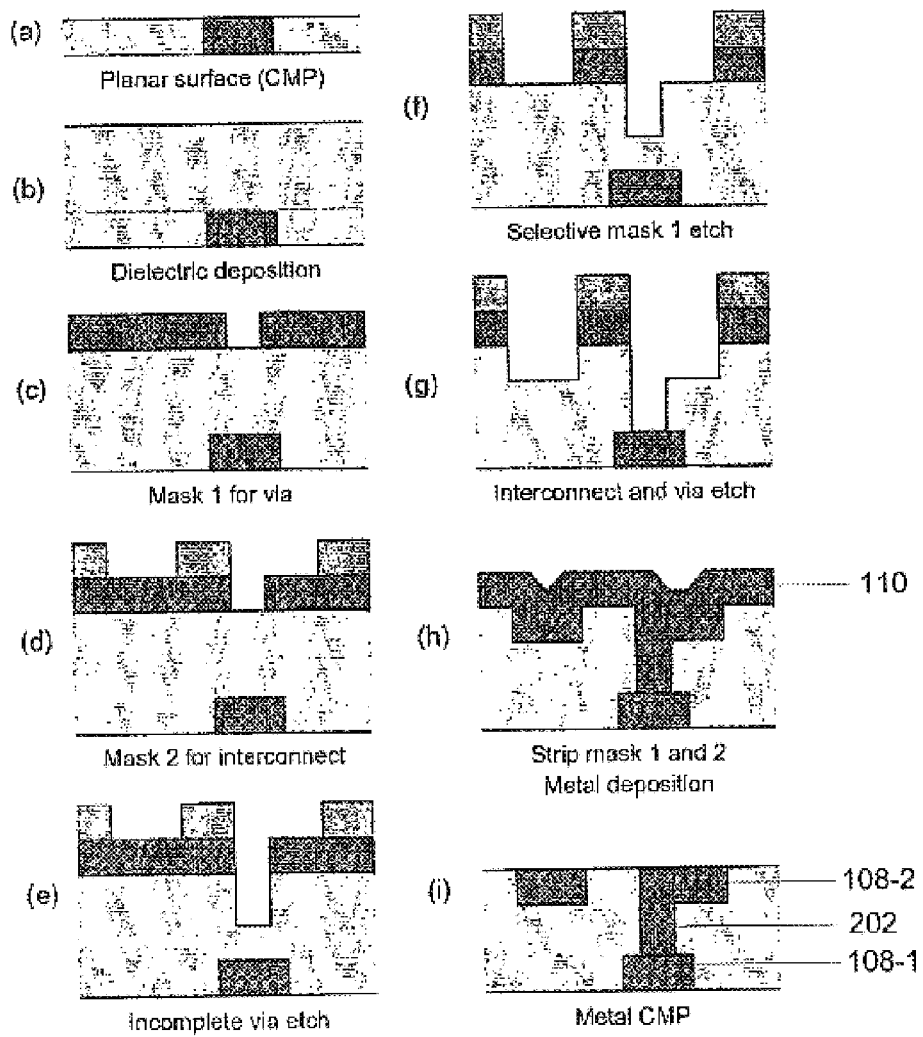
FIG. 2 illustrates a dual Damascene process in accordance with the prior art.
Figure 3:
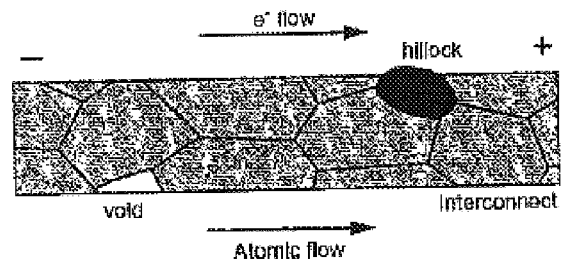
FIG. 3 is a schematic of electromigration.
Figure 6:
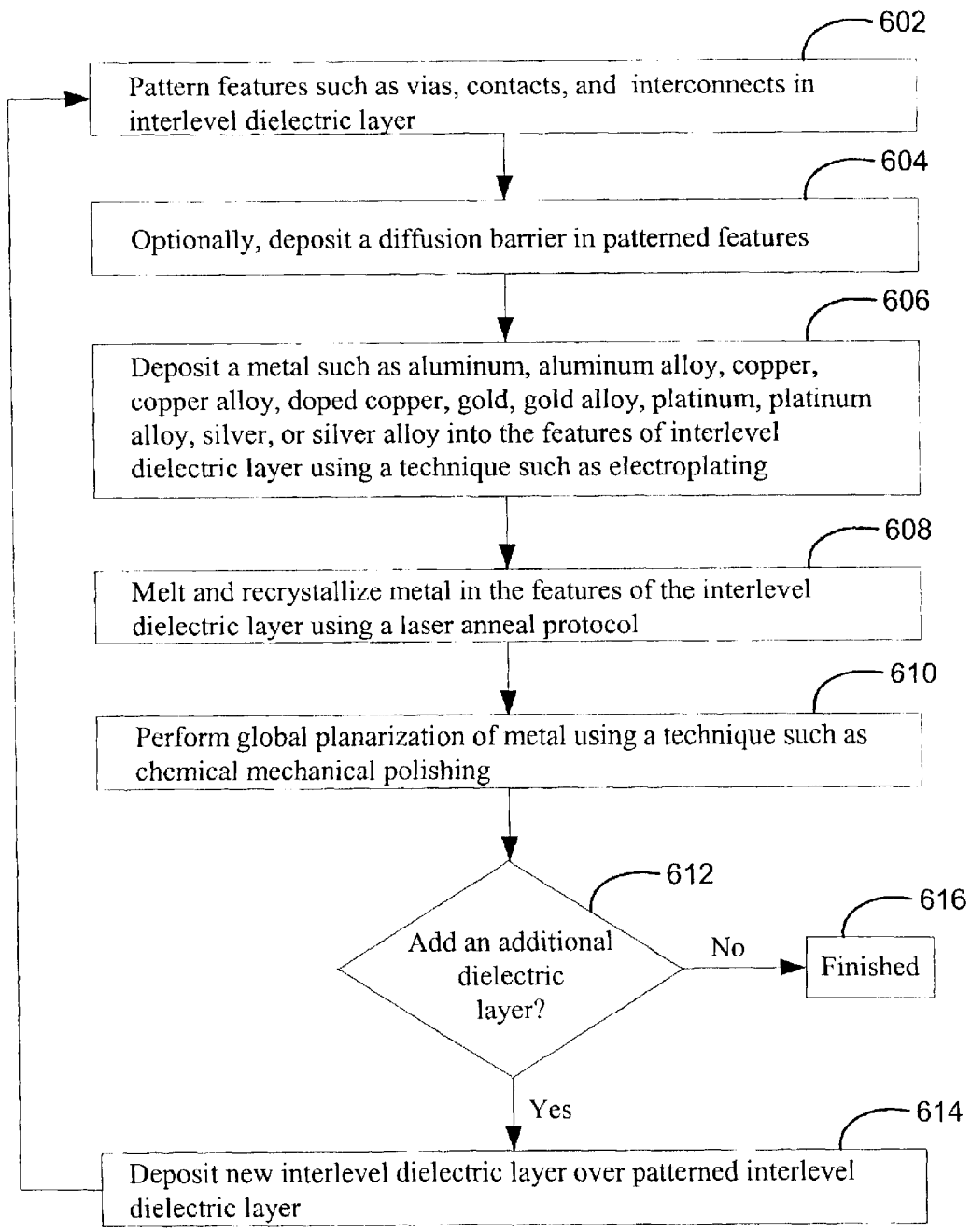
FIG. 6 shows processing steps for a method in accordance with one embodiment of the present invention.
Figure 7:
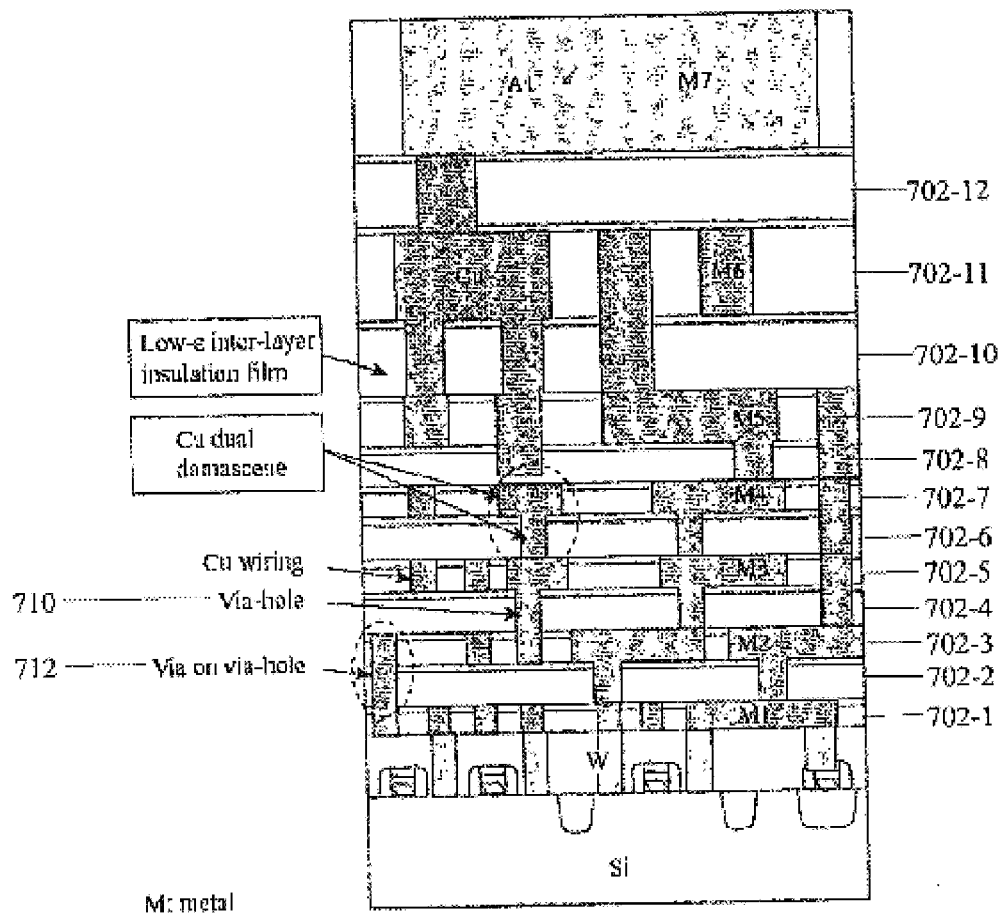
FIG. 7 illustrates a ULSI application in accordance with the prior art.

One embodiment of the inventive method will now be described in detail with reference to FIGS. 1, 2, and 6. This embodiment provides a method for manufacturing semiconductor structures such as central processing units and digital signal processors. The semiconductor structures have an interlevel dielectric, such as interlevel dielectric 102 (FIG. 1a). In the method, interlevel dielectric 102 is deposited on a substrate (not shown in FIG. 1) or, in the case of a multilayer semiconductor structure, on top of a previously deposited interconnect layer. In some embodiments of the present invention, interlevel dielectric 102 comprises $SiO_2$, SiOF, carbon doped silicon oxide, or other low k materials. Next, features are patterned into the interlevel dielectric (FIG. 6, step 602). These features include, for example, interconnects, vias, and contacts. In some embodiments, the features are patterned by reactive ion etching.

Once the features have been patterned into an interlevel dielectric 102, the features are optionally coated with a diffusion barrier (FIG. 6, step 604). A diffusion barrier is represented in FIG. 1 as element 106. Diffusion barrier 106 is used in some embodiments to prevent the metal from diffusing into interlevel dielectric 102. Such diffusion is undesirable because it degrades device performance. For copper, suitable diffusion barriers 106 are made out of materials, that include but are not limited to TiW, TiN, Ta, TaN, Ta—Si—N, or $WN_x$. Depending on the material used to form the diffusion barrier 106, the barrier can be deposited onto the exposed features within interlevel dielectric 102 using a process such as sputtering, chemical vapor deposition (CVD), plasma enhanced CVD (PECVD), or atomic layer deposition (ALD). See, for example, Wang et al., 1993, J. Appl. Phys. 73, 2301–21; Olowolafe et al., 1991, Appl Phys. Lett 58, 469–71; Kim et al., 1996, Appl. Phys. Lett. 69, 4182–4; Ono et al. 1994, Appl Phys. Lett 64, 1511–13.

Once the features have been formed in the interconnect layer (and, optionally, the diffusion barrier has been formed), metal is deposited into the features. In some non-limiting embodiments of the present invention, the depositing is performed by physical vapor deposition (e.g, RF sputtering, bias sputtering, thermal assisted bias sputtering), evaporation, ion beam deposition, thermally assisted ion cluster deposition, chemical vapor deposition, electroless plating, or electroplating. Physical vapor deposition (PVD) has been widely used for aluminum alloy depositions. But conventional PVD is not adequate for metals such as copper in the high aspect ratio features found in modem ULSI applications. However, directional-sputtering techniques, such as ionized sputtering or magnetic field enhanced sputtering, can be employed. In electroless plating, metal atoms are supplied to the interconnect layer by catalyztic reduction of metal ions. In the case of copper, a typical copper electroless process is

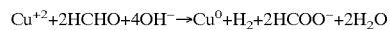

$$Cu^{+2}+2HCHO+4OH^-\rightarrow Cu^0+H_2+2HCOO^-+2H_2O$$

where copper ions are supplied from a copper sulfate pentahydrate ($CuSO4.5H_2O$) solution. In many embodiments, electroplating is preferred over electroless plating because the deposition parameters can be easily controlled in electroplating whereas electroless deposition progresses spontaneously according to the chemistry of the plating bath. By modulating current flow direction in electroplating, both deposition and etching are possible. Thus, superior trench and via filling can be achieved with electroplating using a "pulse-reverse" current waveform providing sequential deposition and etch processes.

In some embodiments of the present invention, the metal used in step 606 is aluminum, aluminum alloy, copper, copper alloy (e.g. a copper aluminum alloy), doped copper, gold, gold alloy, platinum, platinum alloy, silver, or a silver alloy. In some particular embodiments, the metal used in step 606 is copper, copper alloy, or doped copper.

After the metal has been deposited into the features, chemical mechanical polishing is used to perform global planarization in order to remove overburden 110 (FIG. 1c; FIG. 6, step 610). However, as described above, the process window for conditions for successfully achieving global planarization becomes smaller as device feature size is reduced and metals such as copper or copper alloys are used. Furthermore, metals, such as copper and copper alloys that have been deposited by electroplating have poor electromigration and stress migration properties, in part, because of the small crystal size of the plated metal. For these reasons, the present invention provides an innovative laser annealing step 608 before step 610 (FIG. 6). Advantageously, one result of laser annealing step 608 is that grain size is increased and the CMP process window is improved.

In step 608 the metal in the features is melted and recrystallized as a result of the exposure of the metal in the features to a laser in accordance with a laser annealing protocol. In the laser annealing protocol, overburden 110 (FIG. 1c) is exposed to a laser for a sufficient period of time to melt a top layer of the overburden. The top layer of molten overburden, in turn, quickly melts the entire overburden and the metal in the features. Because of the physical properties of the metal used to fill the features, the entire overburden 110 (FIG. 1c) and the metal in the features quickly recrystallizes without damaging optional diffusion barrier 106 or interlevel dielectric 102. This results in the situation illustrated in FIG. 8, in which overburden 110 (FIG. 1c) recrystallizes to form planarized metal surface 802 over dielectric layer 102.

The laser used in the laser annealing protocols 608 of the present invention have suitable wavelengths, pulse lengths, pulse shapes, and pulse energy stability in order to remain within the optimum parameter space for the target process. An additional requirement is for uniform illumination at the substrate surface. Modern optical engineering techniques suggest that multimode cavity operation and wider lasing bandwidth are desirable. Beam homogenization to within one percent over the usable spot area at the substrate usually requires $M^2 > 100$, where M is the conventional "mode number" of the system.

In preferred embodiments of laser annealing protocols 608 of the present invention, lasers that only melt a shallow layer of the overburden are used to prevent damage to the interlevel dielectric and/or other features of the chip. Accordingly, in some embodiments of the present invention, the wavelength of the laser is selected from the range of 150 nm to 900 nm. In some embodiments, the wavelength of the laser is selected from the range of 150 mn to 450 nm. Lasers having such wavelengths are chosen because the depth of the material melted by a laser is a function of the wavelength of the laser.

In some embodiments, the laser annealing protocol 608 comprises a single laser pulse. The pulse length must be long enough to melt the metal in the features for a period of time. Typically, the period of time in which the metal is molten is very short. For example, in some embodiments, the metal is in a molten state for a second or less. In other embodiments, the metal is in a molten state for a millisecond or less.

In some embodiments, the exact amount of energy needed to melt the overburden is substantial. Accordingly, in preferred embodiments, pulsed lasers are used to perform the laser annealing protocol. The amount of output energy needed for the laser annealing protocols of the present invention depends upon the metals used to fill the features in the interlevel dielectric. In some embodiments, output energy in the range of about 1.0 joules/cm$^2$ to about 4.0 joules/cm$^2$ is required. In some embodiments, the laser annealing protocol has a pulse repetition rate of about 10 Hz or greater. In some embodiments of the present invention, the pulse repetition rate of the laser is determined by the duty cycle of the laser.

Figure 4:
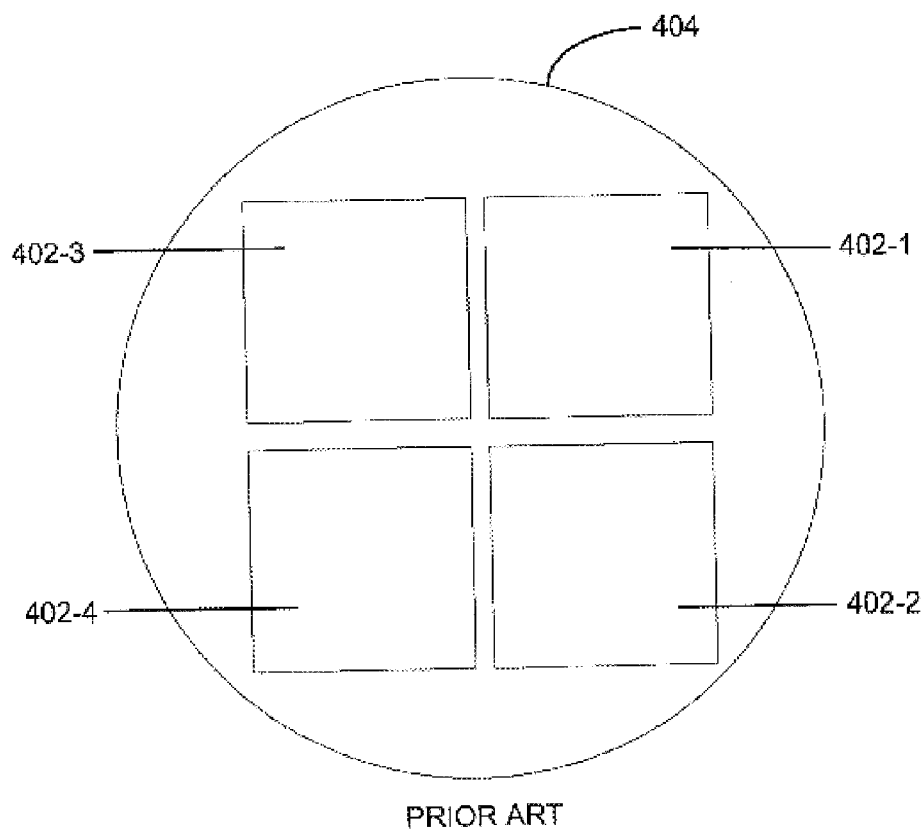
FIG. 4. illustrates the topology of dies on a substrate in accordance with the prior art.

Because of the large output energy that is required in the laser annealing protocols of the present invention, the entire wafer is not exposed to the laser simultaneously. Therefore, in some embodiments, the laser annealing protocol is used to illuminate an individual circuit die on a semiconductor substrate. FIG. 4 illustrates four circuit dies 402 on a semiconductor substrate 404. Each circuit die 402 represents a ULSI structure. Accordingly, in some embodiments of the present invention, the laser annealing protocol illuminates each individual circuit die 402 one-at-a-time with a homogenized laser pulse. In some embodiments, an integral number of dies 402 are illuminated. For example, in some embodiments, an entire row of dies 402 are illuminated.

In some current designs, die sizes are on the order of 6 cm$^2$. Given that an output energy in the range of about 1.0 joules/cm$^2$ to about 4.0 joules/cm$^2$ is required, a laser pulse on the order of 4.2 joules to 7.8 joules is required per die to implement the present invention with such dies.

Figure 5A:
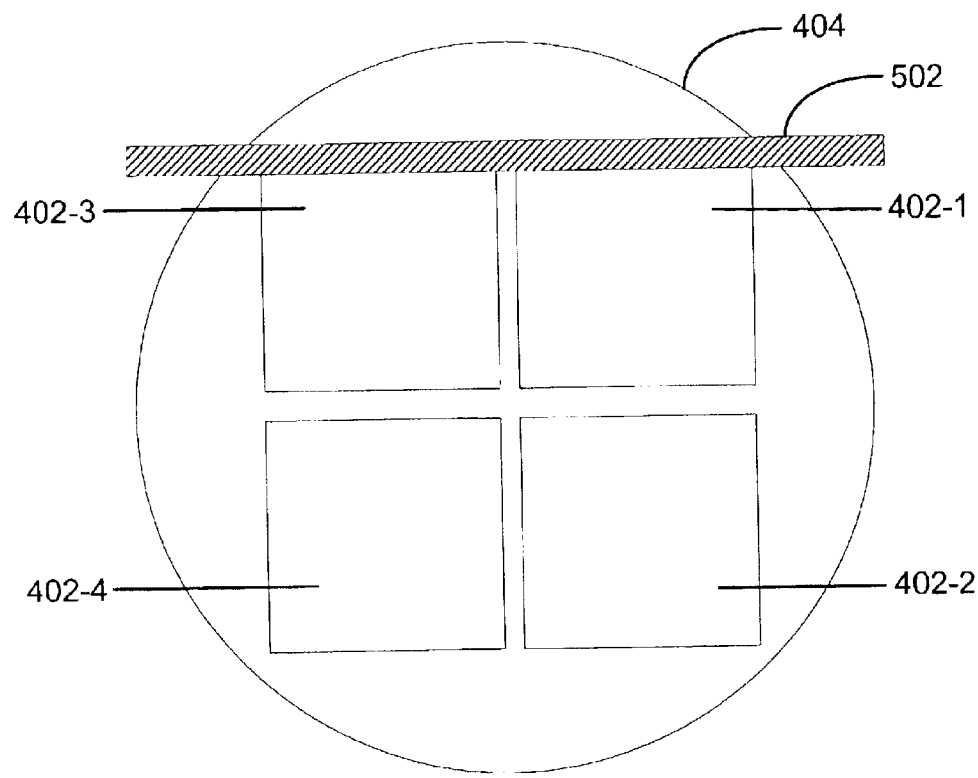
FIGS. 5A and 5B illustrate the progression of a strip of laser fluence across a substrate in accordance with one embodiment of the present invention.
Figure 5B:
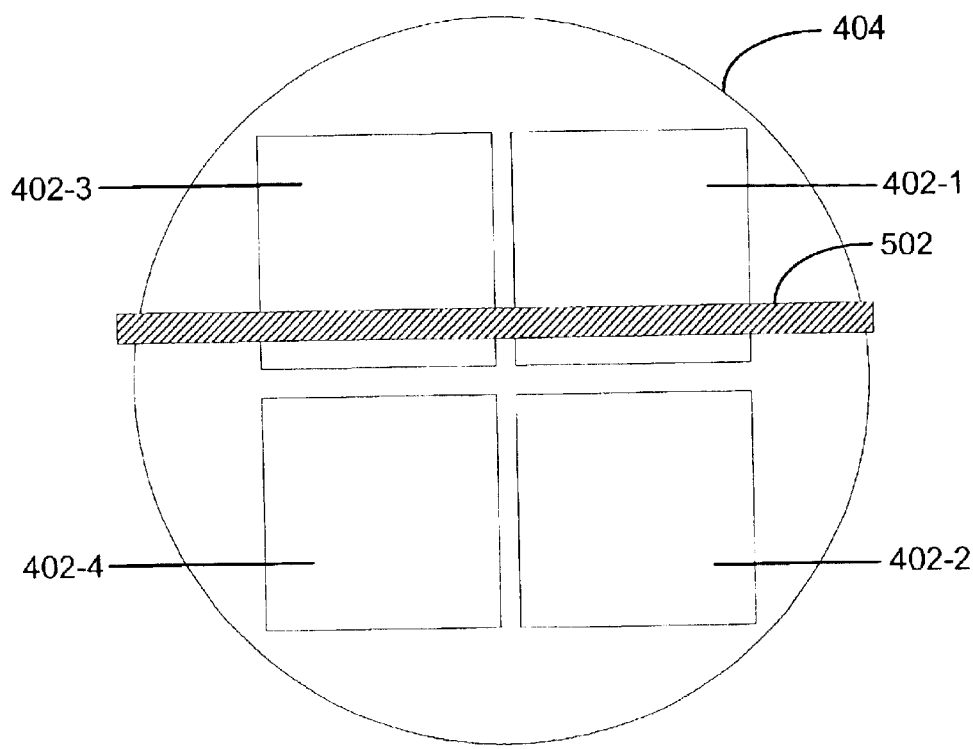

In some embodiments, the laser is collimated so that it forms a homogenized slit that extends across the entire diameter of the substrate. Such embodiments are exemplified by FIGS. 5A and 5B. FIG. 5A shows the zone of illumination 502 produced by the collimated laser at a given time $t_1$. As time progresses, zone 502 gradually moves across substrate 404. FIG. 5B shows the zone of illumination 502 produced by the collimated laser at a given time $t_2$ which is after time $t_1$.

After the metal in the features has been melted and recrystallized by quench cooling using a very short pulse laser (e.g. less than 1 millisecond), a planarized metal surface 802 remains above the interlevel dielectric. In some embodiments of the present invention, this planar metal 802 above interlever dielectric layer 102 (FIG. 8) is removed by a technique such as chemical mechanical polishing (FIG. 6; step 610). This polishing step is referred to as global planarization. The laser anneal step flattens metal surface 802 to some extent. This advantageously improves the process window for performing global planarization.

Figure 8:
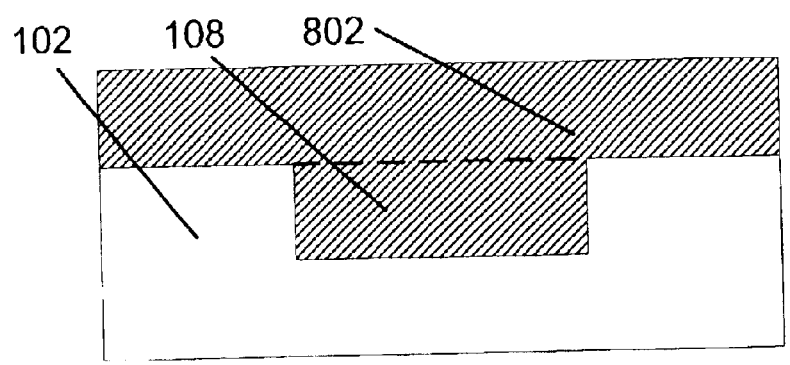
FIG. 8 illustrates a semiconductor structure prior to chemical mechanical polishing.

The process window for global planarization is best understood by considering the structure of metal 802 (FIG. 8). The thickness of the surface metal varies across the interlevel dielectric layer (not shown). Planarization techniques, such chemical mechanical polishing, will polish the metal in a uniform manner. Therefore, if too much polishing is allowed, thinner portions of metal layer 802 will be completely removed and portions of the underlying interlevel dieletric will be damaged. Thus, minimum thickness of the overburden layer serves as a boundary to the process window for the global planarization process.

In another embodiment, a blanket or uniform etching step can be applied to remove the metal 802 overlying the dielectric, leaving the metal inside the trenches intact. This uniform etching process is enabled by the planarization of metal 802 after the laser annealing step, which leaves a uniform thickness of metal above dielectric layer 102.

Annealing protocols that do not deform or damage diffusion barrier 106 or interlevel dielectric 102 are desirable. The laser used in the annealing step must be able to deliver sufficient fluence to melt the metal overburden. However, it is desirable to minimize the melt depth of overburden 110 so that the underlying interlevel dielectric is not damaged. For this reason, lasers that have an ultraviolet wavelength are preferred. In some embodiments, lasers having a visible wavelength are used. Lasers in the ultraviolet wavelength range include, but are not limited to, the molecular fluorine laser ($\lambda$=152 nm), the ArF excimer laser ($\lambda$=192 nm), the KrCl excimer laser ($\lambda$=222 nm), the KrF excimer laser ($\lambda$=248 nm), the XeCl excimer laser ($\lambda$=308 nm), the He—Cd laser ($\lambda$=325 nm), the argon ion laser ($\lambda$=275–306 nm), the nitrogen laser ($\lambda$=337 nm), the Ar ion laser ($\lambda$=330 nm–360 nm), the Kr ion laser ($\lambda$=330 nm–360 nm), the neon laser ($\lambda$=330–380 nm), and the XeF excimer laser ($\lambda$=351 nm). Lasers in the visible wavelength include, but are not limited to, the pulsed dye laser ($\lambda$=320–700 nm), the argon ion laser ($\lambda$=0.450–520 nm), the He—Cd laser ($\lambda$=442 nm), the copper vapor laser ($\lambda$=510 nm), the xenon ion laser ($\lambda$=480 nm–540 nm), the He—Ne laser ($\lambda$=543 nm), the copper vapor laser ($\lambda$=578 nm), the He—Ne laser ($\lambda$=594 nm), the He—Ne laser ($\lambda$=612 nm), the He—Ne laser ($\lambda$=632 nm), the gold vapor laser ($\lambda$=628 nm), the InGaAlP diode laser ($\lambda$=0.630–660 nm), the He—Cd laser ($\lambda$=636 nm), the krypton ion laser ($\lambda$=647 nm), the ruby laser ($\lambda$=694 nm), the GaInP diode laser ($\lambda$=670 nm), the He—Ne laser ($\lambda$=730 nm). In addition, the Alexandrite laser ($\lambda$=720–800 nm) may be used in some embodiments of the present invention. In addition, solid state lasers that may have longer wavelengths but are of sufficient energy to give the appropriate wavelength after energy quadrupling or doubling can be used. In some embodiments, the GaAs laser (λ=880 nm) is used.

A laser generally produces a beam of coherent light that has a wavefront of relatively small cross-section. In spite of the small cross-section and the coherency of the beam, the wavefront of a laser typically has a nonuniform spatial power or energy distribution that is stronger in the center than at the outer edges. For this reason, in a preferred embodiment of the present invention, a homogenizer is used to homogenize the laser. A number of homogenizers are known in the art, as taught, for example, in *Industrial Excimer Lasers*, 2$^{nd}$ ed., Basting, ed., Lambda Physik GmbH, Gottingen. However, in some embodiments, the homogenizer must be customized to deliver laser fluence in a geometry that is suitable for the methods of the present invention. For example, in some embodiments, homogenizer is dimensioned and configured so that a laser fluence is delivered on a die by die basis. In other embodiments, the laser is dimensioned and configured to deliver a row of fluence that is scanned across the substrate Some embodiments of the current invention are applied to the manufacture of patterned semiconductor nodes. In some embodiments of the present invention, the patterned semiconductor node has a technology node of 200 nm or less. In some embodiments of the present invention, the patterned semiconductor node has a technology node of 100 nm or less. As used herein, the term "technology node" refers to the size (width) of the smallest feature in a patterned semiconductor.

Once global planarization has been performed (step 610), a determination is made as to whether an additional dielectric layer 102 is to be added to the ULSI application. If so (FIG. 6; 612-Yes), a new dielectric layer is deposited over the polished interlevel dielectric layer (FIG. 6, step 614) and steps 602 though 610 are repeated. In not (FIG. 6; 612-No), the process ends (FIG. 6; step 616).

In addition to the methods for manufacturing a semiconductor structure having an interlevel dielectric, the present invention provides the structures manufactured by such methods. For example, one aspect of the present invention provides a semiconductor structure having an interlevel dielectric, the semiconductor structure made by a process comprising (i) patterning features in said interlevel dielectric, (ii) depositing a metal into said features, and (iii) recrystallizing metal in the features using a laser. In some embodiments the process further comprises removing an overburden of the metal by chemical mechanical polishing (CMP). In some embodiments, the process further comprises coating the features with a diffusion barrier prior to the depositing step.

Conclusion

All references cited herein are incorporated herein by reference in their entirety and for all purposes to the same extent as if each individual publication or patent or patent application was specifically and individually indicated to be incorporated by reference in its entirety for all purposes. The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the claimed invention.

What is claimed:

1. A method for manufacturing a semiconductor structure having an interlevel dielectric, the method comprising:
    patterning a plurality of features in said interlevel dielectric;
    depositing a metal into said plurality of features;
    melting and recrystallizing said metal in said plurality of features using a laser;
    and coating said plurality of features with a diffusion barrier prior to said depositing;
    wherein said melting and recrystallizing leaves a planarized metal surface over said interlevel dielectric, the method further comprising polishing said planarized metal surface by chemical mechanical polishing (CMP).

2. The method of claim 1 wherein said plurality of features are patterned by reactive ion etching (RIE).

3. The method of claim 1, wherein said plurality of features comprise any combination of interconnects, vias, and contacts.

4. The method of claim 1, wherein said depositing is performed by physical vapor deposition, evaporation, ion beam deposition, thermally assisted ion cluster deposition, chemical vapor deposition, electroless plating, electroplating or electrochemical deposition.

5. The method of claim 4 wherein said physical vapor deposition comprises RF sputtering, bias sputtering, or thermal assisted bias sputtering.

6. The method of claim 1 wherein said semiconductor structure is characterized by a technology node of 200 nm or less.

7. The method of claim 1, wherein said recrystallizing comprises exposing said metal in said plurality of features to a laser annealing protocol that includes exposing the metal to a laser having a predetermined wavelength.

8. The method of claim 7 wherein said wavelength is selected from the range of 150 nm to 900 nm.

9. The method of claim 7 wherein said wavelength is selected from the range of 150 nm to450 nm.

10. The method of claim 7 wherein said laser annealing protocol comprises a single or multiple laser pulse, each pulse within a pulse length range, wherein a lower boundary of said pulse length range is determined by a requirement that the metal in said feature melt for less than a millisecond.

11. The method of claim 7 wherein the laser used in said laser annealing protocol has an output pulse energy of about 1.0 joules/cm$^2$ to about 4.0 joules/cm$^2$.

12. The method of claim 7 wherein the laser used in said laser annealing protocol has a pulse repetition rate of about 10 Hz or greater.

13. The method of claim 7 wherein said laser is selected from the group consisting of a molecular fluorine laser (λ=152 nm), an ArF excimer laser (λ=192 nm), a KrCl excimer laser (λ=222 nm), a KrF excimer laser (λ=248 nm), a XeCl excimer laser (λ=308 nm), a He—Cd laser (λ=325 nm), an argon ion laser (λ=275–306 nm), a nitrogen laser (λ=337 nm), an Ar ion laser (λ=330 nm–360 nm), a Kr ion laser (λ=330 nm–360 nm), a neon laser (λ=330 nm–380 nm), and a XeF excimer laser (λ=351 nm).

14. The method of claim 7 wherein said laser is selected from the group consisting of a pulsed dye laser (λ=320–700 nm), an argon ion laser (λ=0.450–520 nm), a He—Cd laser (λ=442 nm), a copper vapor laser (λ=510 nm), a xenon ion laser (λ=480 nm–540 nm), a He—Ne laser (λ=543 nm), a copper vapor laser (λ=578 nm), a He—Ne laser (λ=594 nm), a He—Ne laser (λ=612 nm), a He—Ne laser (λ=632 nm), a gold vapor laser (λ=628 nm), a InGaAlP diode laser (λ=0.630–660 nm), a He—Cd laser (λ=636 nm), a krypton ion laser (λ=647 nm), a ruby laser (λ=694 nm), a GaInP diode laser (λ=670 nm), a He—Ne laser (λ=730 nm), an Alexandrite laser (λ=720–700 nm), and a GaAs laser (λ=880 nm).

15. The method of claim 1 wherein said metal is selected from the group consisting of aluminum, aluminum alloy, copper, copper alloy, doped copper, gold, gold alloy, platinum, platinum alloy, silver, and silver alloy.

16. The method of claim 1 wherein said metal is copper or copper alloy.

17. The method of claim 1 wherein said semiconductor structure is on a substrate and said recrystallizing comprises simultaneously exposing the entire structure to said laser.

18. The method of claim 1 wherein said semiconductor structure is on a substrate and said recrystallizing comprises exposing a first portion of said substrate at a first time $t_1$ and a second portion of said substrate at a second, subsequent, time $t_2$.

19. A semiconductor structure having an interlevel dielectric, the semiconductor structure made by a process comprising:

patterning a plurality of features in said interlevel dielectric;

depositing a metal into said plurality of features; and melting and recrystallizing metal in said plurality of features using a laser, wherein said melting and recrystallizing leaves a planarized metal surface over said interlevel dielectric, the method further comprising polishing said planarized metal surface by chemical mechanical polishing (CMP).

20. The semiconductor structure of claim 19, wherein said plurality of features are patterned by reactive ion etching (RIE).

21. The semiconductor structure of claim 19, wherein said plurality of features comprise any combination of interconnects, vias, and contacts.

22. The semiconductor structure of claim 19, the process further comprising coating said plurality of features with a diffusion barrier prior to said depositing.

23. The semiconductor structure of claim 19, wherein said depositing is performed by physical vapor deposition evaporation, ion beam deposition, thermally assisted ion cluster deposition, chemical vapor deposition, electroless plating, or electroplating.

24. The semiconductor structure of claim 20, wherein said physical vapor deposition comprises RF sputtering, bias sputtering, or thermal assisted bias sputtering.

25. The semiconductor structure of claim 19, wherein said semiconductor structure is characterized by a technology node of 200 nm or less.

26. The semiconductor structure of claim 19, wherein said recrystallizing comprises exposing said metal in said plurality of features to a laser annealing protocol that includes exposing the metal to a laser having a predetermined wavelength.

27. The semiconductor structure of claim 26, wherein said wavelength is selected from the range of 150 nm to 900 nm.

28. The semiconductor structure of claim 26, wherein said wavelength is selected from the range of 150 nm to 450 nm.

29. The semiconductor structure of claim 26, wherein said laser annealing protocol comprises a single or multiple laser pulse, each pulse within a pulse length range, wherein a lower boundary of said pulse length range is determined by a requirement that the metal in said feature melt for less than a millisecond.

30. The semiconductor structure of claim 26, wherein the laser used in said laser annealing protocol has an output pulse energy of about 1.0 joules/cm$^2$ to about 4.0 joules/cm$^2$.

31. The semiconductor structure of claim 26, wherein the laser used in said laser annealing protocol has a pulse repetition rate of about 10 Hz or greater.

32. The semiconductor structure of claim 26, wherein said laser is selected from the group consisting of a molecular fluorine laser (λ=152 nm), an ArF excimer laser (λ=192 nm), a KrCl excimer laser (λ=222 nm), a KrF excimer laser (λ=248 nm), a XeCl excimer laser (λ=308 mn), a He—Cd laser (λ=325 nm), an argon ion laser (λ=275–306 nm), a nitrogen laser (λ=337 nm), an Ar ion laser (λ=330 nm–360 nm), a Kr ion laser (λ=330 nm–360 nm), a neon laser (λ=330–380 nm), and a XeF excimer laser (λ=351 nm).

33. The semiconductor structure of claim 26, wherein said laser is selected from the group consisting of a pulsed dye laser (λ=320–700 nm), an argon ion laser (λ=0.450–520 nm), a He—Cd laser (λ=442 nm), a copper vapor laser (λ=510 nm), a xenon ion laser (λ=480 nm–540 nm), a He—Ne laser (λ=543 nm), a copper vapor laser (λ=578 nm), a He—Ne laser (λ=594 nm), a He—Ne laser (λ=612 nm), a He—Ne laser (λ=632 nm), a gold vapor laser (λ=628 nm), a InGaAlP diode laser (λ=0.630–660 nm), a He—Cd laser (λ=636 nm), a krypton ion laser (λ=647 nm), a ruby laser (λ=694 nm), a GaInP diode laser (λ=670 nm), a He—NE laser (λ=730 nm), an Alexandrite laser (λ=720–700 nm), and a GaAs layer (λ=880 nm).

34. The semiconductor structure of claim 19, wherein said metal is selected from the group consisting of aluminum, aluminum alloy, copper, copper alloy, doped copper, gold, gold alloy, platinum, platinum alloy, silver, and silver alloy.

35. The semiconductor structure of claim 19, wherein said metal is copper or copper alloy.

36. The semiconductor structure of claim 19, wherein said semiconductor structure is on a substrate and said recrystallizing comprises simultaneously exposing the entire structure to said laser.

37. The semiconductor structure of claim 19, wherein said semiconductor structure is on a substrate and said recrystallizing comprises exposing a first portion of said substrate at a first time $t_1$ and a second portion of said substrate at a second, subsequent, time $t_2$.

38. The method of claim 1 wherein a size of a feature in said plurality of features is 200 nm or less and said melting and recrystallizing said metal lowers the resisitivity of said metal in said feature.

39. The semiconductor structure of claim 19 wherein a size of a feature in said plurality of features is 200 nm or less and said melting and recrystallizing said metal lowers the resisitivity of said metal in said feature.

40. The method of claim 1 wherein said metal Is directly exposed to energy emitted from said laser.

41. The method of claim 1, wherein said melting and recrystallization step sequentially follows said depositing step.

42. The semiconductor structure of claim 19, wherein said metal is directly exposed to energy emitted from said laser.

43. The semiconductor structure of claim 19, wherein said melting and recrystallization step sequentially follows said depositing step.

* * * * *

UNITED STATES PATENT AND TRADEMARK OFFICE
CERTIFICATE OF CORRECTION

PATENT NO. : 6,835,657 B2
DATED : December 28, 2004
INVENTOR(S) : Ong

It is certified that error appears in the above-identified patent and that said Letters Patent is hereby corrected as shown below:

Title page,
Item [56], References Cited, OTHER PUBLICATIONS, "Ryu, Changsup, 1998" reference, delete "requirement" and insert -- requirements --, therefor.

Column 6,
Line 17, delete "modem" and insert -- modern --, therefor.

Column 7,
Line 24, delete "150 mn" and insert -- 150 nm --, therefor.

Column 10,
Line 42, delete "to450 nm" and insert -- to 450 nm --, therefor.

Column 11,
Line 29, after "recrystallizing" insert -- said --.
Line 46, after "deposition" insert -- , --.

Column 12,
Line 29, delete "He-NE" and insert -- He-Ne --, therefor.
Lines 49 and 54, delete "resisitivity" and insert -- resistivity --, therefor.
Line 55, after "metal" delete "Is" and insert -- is --, therefor.

Signed and Sealed this

Nineteenth Day of July, 2005

JON W. DUDAS
*Director of the United States Patent and Trademark Office*